(12) United States Patent  
Satou

(10) Patent No.: US 7,880,306 B2
(45) Date of Patent: Feb. 1, 2011

(54) SEMICONDUCTOR DEVICE AND METHOD OF PRODUCING THE SAME

(75) Inventor: Yoshitaka Satou, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 287 days.

(21) Appl. No.: 12/076,134

(22) Filed: Mar. 14, 2008

(65) Prior Publication Data

US 2008/0237878 A1 Oct. 2, 2008

(30) Foreign Application Priority Data

Mar. 29, 2007 (JP) ............................. 2007-087145

(51) Int. Cl.
*H01L 23/48* (2006.01)
*H01L 21/4763* (2006.01)
*H01L 21/44* (2006.01)

(52) U.S. Cl. .................... 257/773; 257/499; 257/506; 257/E23.141; 257/E23.142; 257/E23.145

(58) Field of Classification Search ............... 257/773
See application file for complete search history.

(56) References Cited

U.S. PATENT DOCUMENTS

| 6,137,149 | A * | 10/2000 | Kodama | 257/408 |
| 6,376,368 | B1 * | 4/2002 | Jung et al. | 438/639 |
| 6,649,976 | B2 * | 11/2003 | Iwamatsu et al. | 257/344 |
| 7,414,291 | B2 * | 8/2008 | Michimata et al. | 257/368 |
| 2002/0008295 | A1 * | 1/2002 | Yang et al. | 257/413 |
| 2002/0048919 | A1 * | 4/2002 | Iwamatsu et al. | 438/592 |
| 2002/0102802 | A1 * | 8/2002 | Tan et al. | 438/305 |
| 2003/0162359 | A1 * | 8/2003 | Yang et al. | 438/300 |
| 2003/0207565 | A1 * | 11/2003 | Tan et al. | 438/664 |
| 2005/0167765 | A1 * | 8/2005 | Hokazono | 257/408 |
| 2006/0211200 | A1 * | 9/2006 | Tomita | 438/257 |
| 2007/0018254 | A1 * | 1/2007 | Yoo et al. | 257/382 |
| 2007/0096212 | A1 * | 5/2007 | Sato et al. | 257/350 |
| 2007/0114671 | A1 * | 5/2007 | Hsu et al. | 257/774 |
| 2007/0123018 | A1 * | 5/2007 | Asano | 438/597 |
| 2007/0161225 | A1 * | 7/2007 | Peters et al. | 438/618 |
| 2007/0166915 | A1 * | 7/2007 | Fazan et al. | 438/253 |
| 2007/0228427 | A1 * | 10/2007 | Matsui et al. | 257/288 |
| 2008/0146014 | A1 * | 6/2008 | Ding | 438/597 |
| 2008/0150024 | A1 * | 6/2008 | Surdeanu et al. | 257/347 |
| 2008/0237878 | A1 * | 10/2008 | Satou | 257/773 |

FOREIGN PATENT DOCUMENTS

JP 2004-343015 12/2004

* cited by examiner

*Primary Examiner*—Leonardo Andújar
*Assistant Examiner*—William Harriston
(74) *Attorney, Agent, or Firm*—Kubotera & Associates LLC

(57) ABSTRACT

A semiconductor device includes a semiconductor substrate having a main surface; an element separation film formed on the main surface in an element separation area and extending in a first direction; and a semiconductor element formed on the main surface in an active area and arranged in a second direction perpendicular to the first direction. The semiconductor element includes a metal silicide film. The metal silicide film includes a first portion adjacent to the element separation film. The semiconductor device further includes an interlayer insulation film formed on the main surface of the semiconductor substrate; a wiring portion formed on the interlayer insulation film; and a conductive plug formed in the interlayer insulation film for electrically connecting the semiconductor elements and the wiring portion. The conductive plug is situated on the element separation film and the metal silicide film.

8 Claims, 16 Drawing Sheets

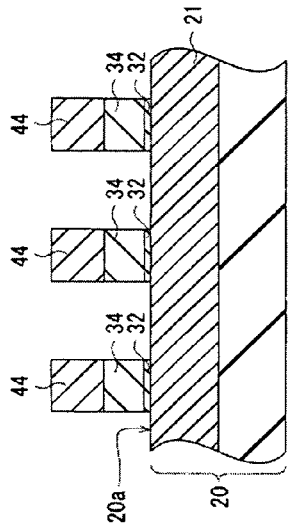
Fig. 7 (C)
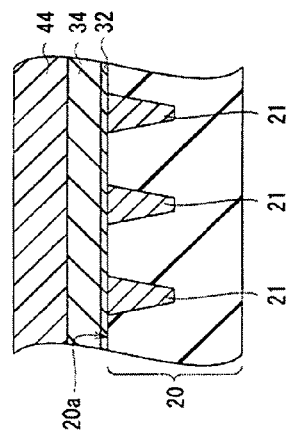
Fig. 7 (D)
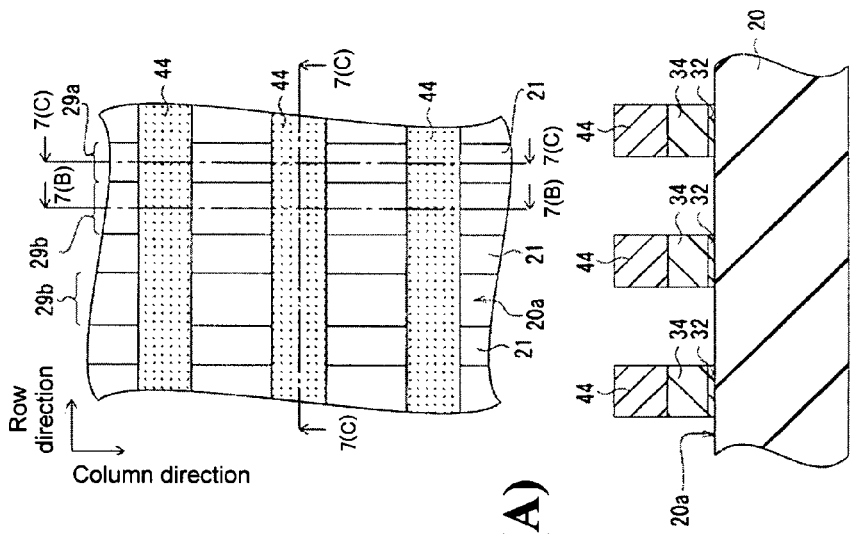
Fig. 7 (A)
Fig. 7 (B)

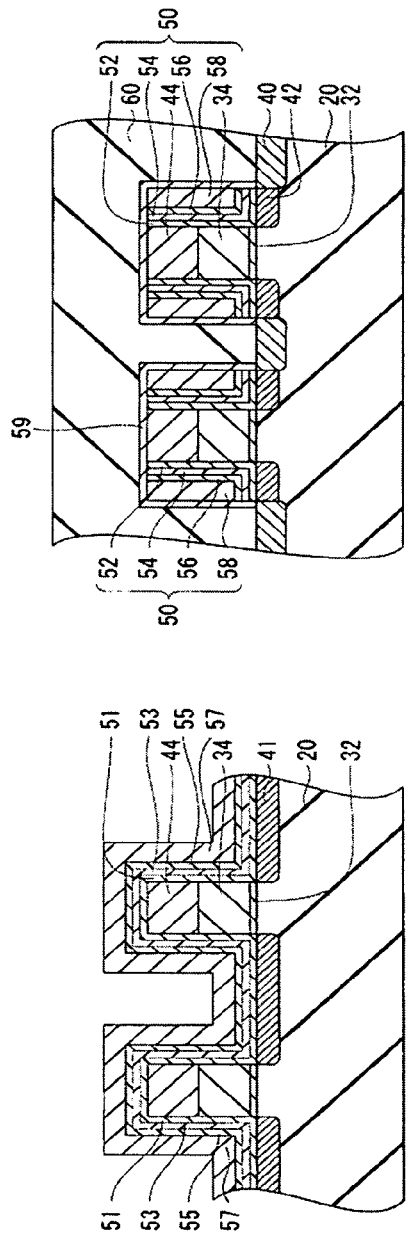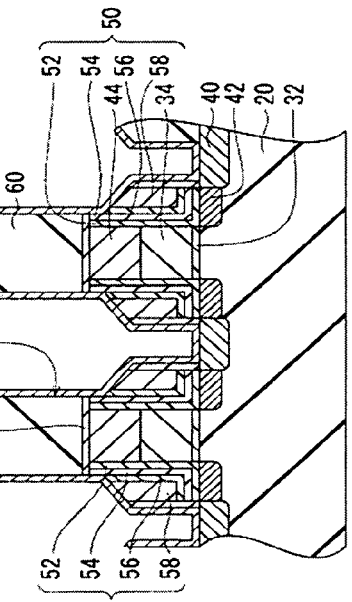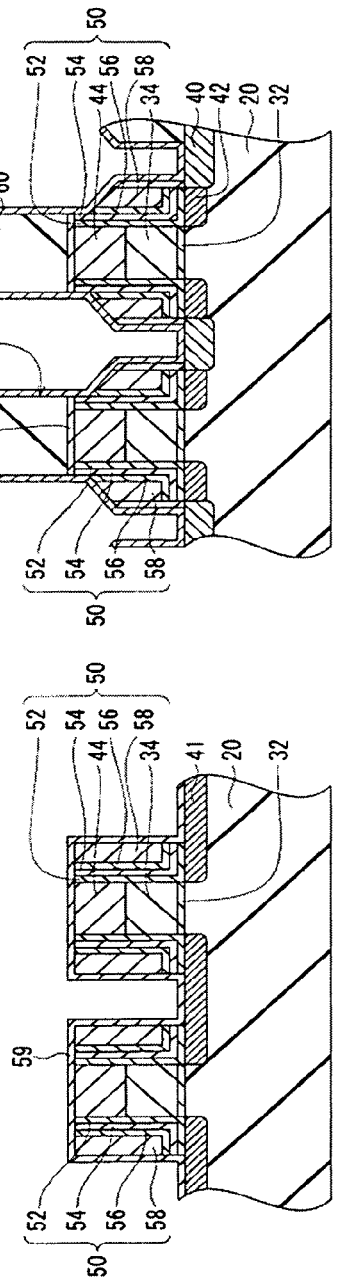
Fig. 8 (A)
Fig. 8 (B)
Fig. 8 (C)
Fig. 8 (D)

Fig. 15 (A) Prior Art
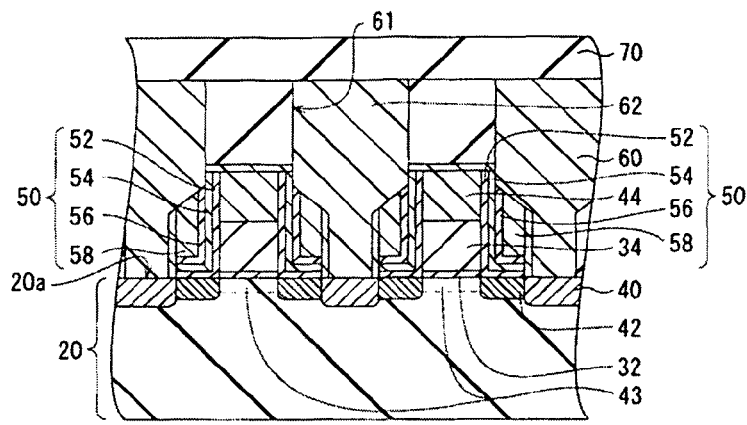
Fig. 15 (B) Prior Art
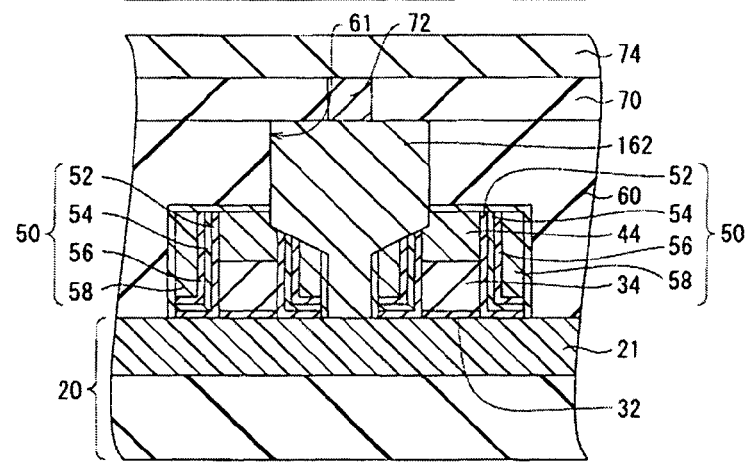
Fig. 15 (C) Prior Art
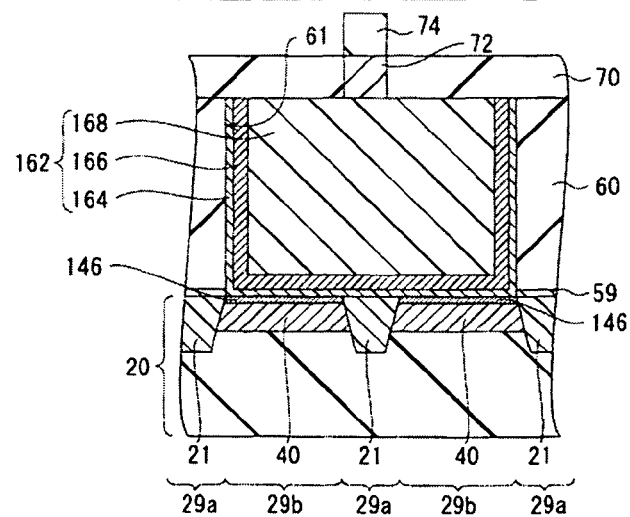

SEMICONDUCTOR DEVICE AND METHOD OF PRODUCING THE SAME

BACKGROUND OF THE INVENTION AND RELATED ART STATEMENT

The present invention relates to a semiconductor device and a method of producing the semiconductor device. In particular, the present invention relates to a semiconductor device, in which a contact plug has a specific configuration so that a contact resistivity does not increase even through a shift in an alignment occurs when a contact hole is formed.

As a conventional semiconductor device, a semiconductor non-volatile memory having memory cells arranged in a matrix pattern has been proposed (refer to Patent Reference). Patent Reference: Japanese Patent Publication No. 2004-343015

A configuration of the conventional semiconductor non-volatile memory disclosed in Patent Reference will be explained with reference to FIG. 14 and FIGS. 15(A) to 15(C). FIG. 14 is a schematic view showing the configuration of the conventional semiconductor non-volatile memory having memory cells 15 arranged in a matrix pattern.

FIGS. 15(A) to 15(C) are schematic sectional views showing the conventional semiconductor non-volatile memory. More specifically, FIG. 15(A) is a sectional view thereof taken along a line 15(A)-15(A) in FIG. 14, FIG. 15(B) is a sectional view thereof taken along a line 15(B)-15(B) in FIG. 14, and FIG. 14(C) is a sectional view thereof taken along a line 15(C)-15(C) in FIG. 14.

In the conventional semiconductor non-volatile memory, active areas (AC) 29b, and gate electrodes (CG) 34 are arranged to cross with each other in a matrix pattern. Each of the active areas 29b, has a rectangular shape with a longitudinal direction thereof aligned with a column direction of the matrix pattern, and each of the gate electrodes 34 has a rectangular shape with a longitudinal direction thereof aligned with a row direction of the matrix pattern. Further, the active areas 29b are separated with element separation areas 29a, extending in the column direction.

Each of the memory cells 15 is a so-called sidewall type memory, in which sidewall portions 50 capable of accumulating electric charges are disposed to sandwich the gate electrode of an MOS (Metal Oxide Semiconductor) type field effect transistor. The sidewall portion 50 has a laminated structure capable of accumulating electric charges, in which a lower insulation film 52, an electric charge accumulation film 54, an upper insulation film 56, and a sidewall nitride film 58 are laminated in this order.

In the conventional semiconductor non-volatile memory, the gate electrodes 34 extend along the row direction. With the configuration described above, the memory cells 15 arranged in the column direction adjacent to with each other share an impurity diffused area functioning as a source-drain. Accordingly, it is not necessary to provide an element separation area between the memory cells 15 arranged in the column direction adjacent to with each other, thereby reducing an element forming area.

In the memory cells 15 arranged in the row direction adjacent to with each other, impurity diffused areas 40 thereof are electrically connected to one bit line through a conductive plug or cell contact 162 having an oval column shape. Accordingly, it is not necessary to provide a wiring portion for connecting the impurity diffused areas 40 of the memory cells 15 arranged in the row direction adjacent to with each other, thereby reducing an element forming area. The conductive plug 162 includes a titanium film 164, a titanium nitride film 166, and a tungsten conductive member 168.

Further, with the configuration described above, it is possible to produce the cell contacts (CC) 162 along the column direction in a self-compatible manner. Accordingly, it is possible to minimize a variation in a property due to an alignment of the cell contacts (CC) 162 with respect to the gate electrodes (CG) 34 (referred to as a CC-CG alignment). As a result, it is not necessary to provide a margin for the CC-CG alignment, thereby reducing an element forming area.

In the configuration described above, however, a resistivity of the cell contact 162 may increase or cause a variation in a resistivity thereof due to a shift in the alignment of the cell contacts (CC) 162 with respect to the active areas (AC) 29b, (referred to as a CC-AC alignment).

With reference to FIG. 16, the resistivity of the cell contact 162 (referred to as a contact resistivity) will be explained in a case that the shift in the CC-AC alignment occurs. FIG. 16 is a schematic sectional view showing the conventional semiconductor non-volatile memory for explaining the shift in the CC-AC alignment.

When the shift in the CC-AC alignment occurs, an area of a semiconductor substrate exposed at a bottom surface of a contact hole 61 decreases upon forming the cell contact 162. Accordingly, when a metal silicide film 146 is formed in a later step, an area of the metal silicide film 146 having a low resistivity also decreases. When the area of the metal silicide film 146 decreases, the contact resistivity increases.

When the contact resistivity increases, it may be difficult to apply a sufficient voltage to a drain upon wiring the memory cell 15, thereby causing a decrease in a writing speed or a writing error. Further, when reading out from the memory cell 15, it is difficult to supply a sufficient voltage to the drain, thereby causing a reading error.

In view of the problems described above, an object of the present invention is to provide a semiconductor device and a method of producing the semiconductor device capable of solving the problems of the conventional semiconductor device. In the semiconductor device, it is possible to prevent a contact resistivity from increasing even when a shift in an alignment of a cell contact (CC) with respect to an active area (AC) occurs.

Further objects and advantages of the invention will be apparent from the following description of the invention.

SUMMARY OF THE INVENTION

In order to attain the objects described above, according to a first aspect of the present invention, a semiconductor device includes a semiconductor substrate; an interlayer insulation film; and a conductive plug. The semiconductor substrate includes, on a main surface thereof, an element separation film extending in a first direction and a plurality of semiconductor elements arranged in a second direction perpendicular to the first direction. The interlayer insulation film is formed on the main surface of the semiconductor substrate. The conductive plug is formed in the interlayer insulation film for electrically connecting the semiconductor elements and a wiring portion formed on the interlayer insulation film.

Further, the semiconductor element is formed in an active area defined between element separation areas with element separation films formed therein. The semiconductor element further includes a metal silicide film on the main surface of the semiconductor substrate. The conductive plug is formed in the element separation film and the metal silicide film of the semiconductor elements arranged adjacent to with each other with the element separation film therebetween. The metal silicide film includes a first portion disposed adjacent to the element separation film and a second portion disposed away from the element separation film. The first portion has a thickness larger than that of the second portion.

According to a second aspect of the present invention, a method of producing a semiconductor device includes the steps of:

forming a plurality of element separation films extending in a first direction on a main surface of a semiconductor substrate in element separation areas to define active areas between the element separation areas;

forming a semiconductor element on the main surface of the semiconductor substrate in the active area;

forming an interlayer insulation film on the main surface of the semiconductor substrate for covering the semiconductor substrate and the semiconductor element;

forming a contact hole in the interlayer insulation film on the element separation film and the active areas arranged adjacent to with each other with the element separation film in between, so that the element separation film and the active areas arranged adjacent to with each other with the element separation film in between are exposed in the contact hole;

etching the element separation film exposed in the contact hole, so that an upper surface of the element separation film is situated below the main surface of the semiconductor substrate; and forming a high melting point metal film in the contact hole to form a metal silicide film on an upper surface of the active area having a first portion arranged adjacent to the element separation film and a second portion arranged away from the element separation film.

In the metal silicide film, the first portion has a thickness larger than that of the second portion. Afterward, a contact layer is formed on the high melting point metal film or the metal silicide film, and the contact hole is filled with a conductive member to form a conductive plug.

In the semiconductor device and the method of producing the semiconductor device of the present invention, the metal silicide film contacting with the conductive plug has the first portion arranged adjacent to the element separation film and the second portion arranged away from the element separation film. Further, the first portion has a thickness larger than that of the second portion.

With the configuration described above, the first portion having a lower resistivity has an influence on a contact resistivity greater than that of the second portion. Accordingly, the contact resistivity becomes mostly equal to a resistivity of the first portion. As a result, when a shift in an alignment of a cell contact with respect to the active area occurs, and an area of the semiconductor substrate contacting with the conductive plug decreases, the contact resistivity does not increase.

BRIEF DESCRIPTION OF THE DRAWINGS

FIGS. 2(A) to 2(C) are schematic sectional views showing the semiconductor device according to the first embodiment of the present invention, wherein FIG. 2(A) is a sectional view thereof taken along a line 2(A)-2(A) in FIG. 1, FIG. 2(B) is a sectional view thereof taken along a line 2(B)-2(B) in FIG. 1, and FIG. 2(C) is a sectional view thereof taken along a line 2(C)-2(C) in FIG. 1;

FIGS. 6(A) to 6(C) are schematic views showing a method of producing the semiconductor device according to the first embodiment of the present invention, wherein FIG. 6(A) is a schematic plan view of the semiconductor device, FIG. 6(B) is an enlarged sectional view thereof taken along a line 6(B)-6(B) in FIG. 6(A), and FIG. 6(C) is an enlarged sectional view thereof taken along a line 6(C)-6(C) in FIG. 6(A);

FIGS. 7(A) to 7(D) are schematic views showing the method of producing the semiconductor device according to the first embodiment of the present invention, wherein FIG. 7(A) is a schematic plan view of the semiconductor device after a gate electrode is formed, FIG. 7(B) is an enlarged sectional view thereof taken along a line 7(B)-7(B) in FIG. 7(A), FIG. 7(C) is an enlarged sectional view thereof taken along a line 7(C)-7(C) in FIG. 7(A), and FIG. 7(D) is an enlarged sectional view thereof taken along a line 7(D)-7(D) in FIG. 7(A);

FIGS. 8(A) to 8(D) are schematic enlarged sectional views corresponding to the enlarged sectional view thereof taken along the line 7(B)-7(B) in FIG. 7(A) and showing the method of producing the semiconductor device according to the first embodiment of the present invention;

FIGS. 15(A) to 15(C) are schematic sectional views showing the conventional semiconductor non-volatile memory, wherein FIG. 15(A) is a sectional view thereof taken along a line 15(A)-15(A) in FIG. 14, FIG. 15(B) is a sectional view thereof taken along a line 15(B)-15(B) in FIG. 14, and FIG. 15(C) is a sectional view thereof taken along a line 15(C)-15(C) in FIG. 14.

DETAILED DESCRIPTION OF PREFERRED EMBODIMENTS

Figure 1:
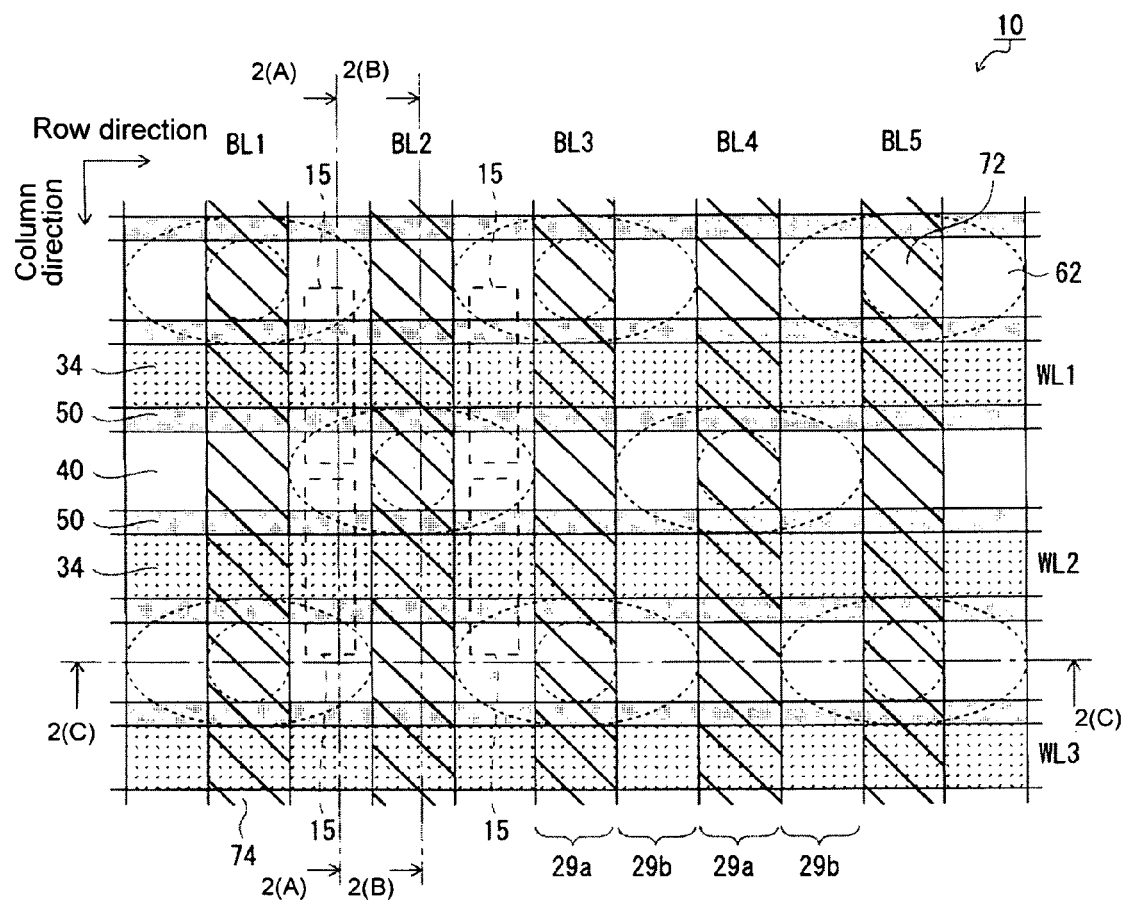
FIG. 1 is a schematic view showing a general configuration of a semiconductor non-volatile memory according to a first embodiment of the present invention.

Hereunder, embodiments of the present invention will be explained with reference to the accompanying drawings. In the following description of the present invention, each of the drawings is illustrated schematically in terms of a shape, a size, and a dimensional relationship for explaining the embodiments of the present invention, and the present invention is not limited to the shape, the size, and the dimensional relationship shown in the drawings.

First Embodiment

A first embodiment of the present invention will be explained with reference to FIGS. 1 and 2(A) to 2(C). In the following description, a semiconductor non-volatile memory will be explained as a semiconductor device of the present invention.

Figure 2:
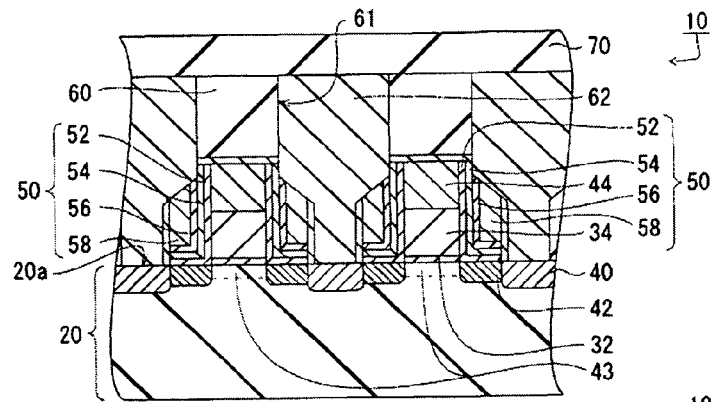
Figure 2:
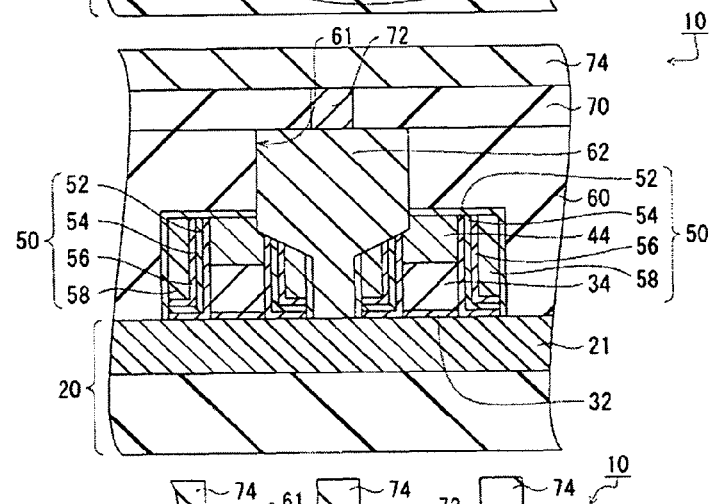
Figure 2:
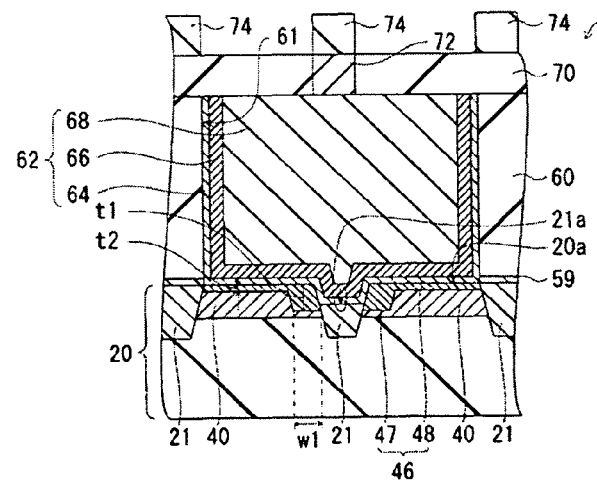

FIG. 1 is a schematic view showing a general configuration of the semiconductor non-volatile memory according to the first embodiment of the present invention. FIGS. 2(A) to 2(C) are schematic sectional views showing the semiconductor device according to the first embodiment of the present invention. More specifically, FIG. 2(A) is a sectional view thereof taken along a line 2(A)-2(A) in FIG. 1, FIG. 2(B) is a sectional view thereof taken along a line 2(B)-2(B) in FIG. 1, and FIG. 2(C) is a sectional view thereof taken along a line 2(C)-2(C) in FIG. 1. In the following description, a first direction represents a column direction, and a second direction represents a row direction.

In the embodiment, a plurality of element separation films 21 is formed in a semiconductor substrate 20 having a first conductive type. The element separation films 21 extend in the column direction, and are arranged in parallel with each other with a constant space therebetween. The element separation films 21 are formed with an STI (Shallow Trench Isolation) method, and are arranged in element separation areas 29a. Active areas 29b, are disposed between the element separation areas 29a.

In the embodiment, memory cells 15 are arranged in the column direction and the row direction, and the element separation films 21 are disposed between the memory cells 15 arranged adjacent to with each other in the row direction. In other words, the memory cells 15 are disposed in the active areas 29b.

In the embodiment, each of the memory cells 15 includes an electric filed transistor having an MOS type (MOSFET; Metal Oxide Semiconductor Field Effect Transistor). The MOSFET includes a gate electrode 34, a pair of impurity diffused areas or impurity diffused portions 40; and a pair of sidewall portions 50.

In the embodiment, the semiconductor substrate 20 of the first conductive type is, for example, a silicon substrate of a p-type. In this case, the MOSFET has a second conductive type different from the first conductive type. That is, when the first conductive type is the p-type, the MOSFET is an MOSFET of an n-type (NMOS). Note that the semiconductor substrate 20 of the p-type may include a semiconductor substrate having a well of the p-type. In this case, the NMOS is formed in the well.

In the embodiment, the gate electrodes 34 (CG) are formed on a main surface 20a, of the semiconductor substrate 20 with gate insulation films 32 in between. The gate electrodes 34 are arranged in the second direction (the row direction) perpendicular to the first direction. Further, the gate electrodes 34 are commonly used by the memory cells 15 arranged in the row direction. That is, the gate electrodes 34 (CG) are used as word lines (WL).

In the embodiment, the gate electrodes 34 have a polycide structure having laminated layers, i.e., a poly-silicon film and a tungsten silicide film as a metal silicide film being alternately laminated. Nitride film masks 44 are disposed on the gate electrodes 34.

In the embodiment, pairs of the impurity diffused portions 40 are areas included in the active areas 29b,, and are situated in the main surface 20a, of the semiconductor substrate 20. When the main surface 20a, of the semiconductor substrate 20 is viewed from above in a plane view, the impurity diffused portions 40 are arranged to sandwich the gate electrodes 34 and apart from the gate electrodes 34. In the impurity diffused portions 40, an impurity of the second conductive type, i.e., an n-type impurity such as arsenic (As), is diffused at a high concentration. Note that the impurity diffused portions 40 function as a drain or a source during an operation of the MOSFET.

In the embodiment, pairs of the sidewall portions 50 are disposed on the main surface 20a, of the semiconductor substrate 20 and the element separation films 21 adjacent to the gate electrodes 34, or directly contacting with the gate electrodes 34. More specifically, the sidewall portions 50 are disposed on the main surface 20a, of the semiconductor substrate 20 and the element separation films 21 contacting with side surfaces of the gate insulation films 32, the gate electrodes 34, and the nitride film masks 44. When the main surface 20a, of the semiconductor substrate 20 is viewed from above in a plane view, the sidewall portions 50 are arranged adjacent to the impurity diffused portions 40.

In the embodiment, the sidewall portions 50 have a laminated structure (referred to as an ONO structure) capable of accumulating electric charges. That is, each of the sidewall portions 50 is formed of a lower insulation film 52; an electric charge accumulation film 54; an upper insulation film 56; and a sidewall nitride film 58 laminated in this order. Note that the sidewall portions 50 are formed in a sidewall shape at positions sandwiching the gate electrodes 34 in a gate longitudinal direction.

In the embodiment, the MOSFET further includes low concentration impurity diffused areas 42 formed in the semiconductor substrate 20 below the sidewall portions 50 to contact with the main surface 20a, and the impurity diffused portions 40. More specifically, pairs of the low concentration impurity diffused areas 42 are disposed between channel forming areas 43 (where channel are formed) and the impurity diffused portions 40 just below the gate electrodes 34.

In the embodiment, the low concentration impurity diffused areas 42 have an impurity concentration lower than that of the impurity diffused portions 40, and have a conductive type the same as that of the impurity diffused portions 40. When the impurity diffused portions 40 have the conductive type of the n-type, an impurity such as arsenic (As) is introduced into the low concentration impurity diffused areas 42 at a lower concentration.

In the embodiment, the lower insulation films 52 have a uniform thickness of about 5, to 10, μm, and are formed in an L shape over a range from the main surface 20a, of the semiconductor substrate 20 to the sidewalls of the gate electrodes 34 and the nitride film masks 44. Further, the electric charge accumulation films 54 have a uniform thickness of about 5, to 10, μm, and are formed in an L shape on the lower insulation films 52.

Further, the upper insulation films 56 have a uniform thickness of about 5, to 10, μm, and are formed in an L shape on the electric charge accumulation films 54. Further, the sidewall nitride films 58 have a uniform thickness of about 20 to 40, μm, and are formed on the upper insulation films 56.

When carriers are introduced into the sidewall portions 50, the carriers are accumulated mainly in the electric charge accumulation films 54 among the sidewall portions 50. Note that the sidewall portions 50 may be formed of a material appropriately selected according to an application of the memory.

More specifically, the sidewall portions 50 may have a structure, in which the electric charge accumulation films 54 are formed of one or more insulation films selected from a silicon nitride film, an aluminum oxide film, and a hafnium oxide film, and are sandwiched between the lower insulation films 52 and the upper insulation films 56. When the pair of the sidewall portions 50 is disposed at positions sandwiching the gate electrode 34, it is possible to write information in two-bit into one memory cell.

In the embodiment, interlayer insulation films 60 are formed on the main surface 20a, of the semiconductor substrate 20. Contact holes 61 are formed in the interlayer insulation films 60. Further, conductive plugs 62 are embedded in the contact holes 61 for electrically connecting the impurity diffused portions 40 and wiring portions 74 disposed at an upper portion.

In the embodiment, metal silicide films 46 are formed in the impurity diffused portions 40 of the memory cells 15 arranged adjacent to with each other in the row direction with the element separation films 21 in between, so that the element separation films 21 and the metal silicide films 46 are exposed in the contact holes 61. Accordingly, the conductive plugs 62 disposed in the contact holes 61 electrically connect the impurity diffused portions 40 of the memory cells 15 arranged adjacent to with each other.

More specifically, titanium silicide films as the metal silicide films 46 are formed on upper surfaces of the impurity diffused portions 40 and exposed in the contact holes 61. For example, titanium (Ti) films are formed on sidewalls of the contact holes 61 as high melting temperature metal films 64, and titanium nitride (TiN) films are formed on bottom surfaces of the contact holes 61 as close contact films 66. Further, tungsten (W) is embedded in the contact holes 61 as conductive members 68. The titanium (Ti) films as the high melting temperature metal films 64 may not be formed on the element separation films 21 and the interlayer insulation films 60 exposed from the sidewalls of the contact holes 61.

In the embodiment, the metal silicide films 46 have first portions 47 adjacent to the element separation films 21 exposed in the contact holes 61 and second portions 48 away from the element separation films 21. The first portions 47 of the metal silicide films 46 have a thickness t1 larger than a thickness t2 of the second portions 48. A method of producing the first portions 47 and the second portions 48 will be explained later.

In a conventional method of producing a metal silicide film, the metal silicide film has a thickness of about 10, nm. In the embodiment, it is preferred that the first portions 47 of the metal silicide films 46 have the thickness t1 and a width w1 greater than 10, nm, so that the first portions 47 contacting with the element separation films 21 have a low resistivity.

Further, it is preferred that the first portions 47 of the metal silicide films 46 have the thickness t1 and the width w1 smaller than 50, nm, thereby preventing an etching process for lowering a position of upper surfaces 21a, of the element separation films 21 and an increase in a leak current.

Figure 3:
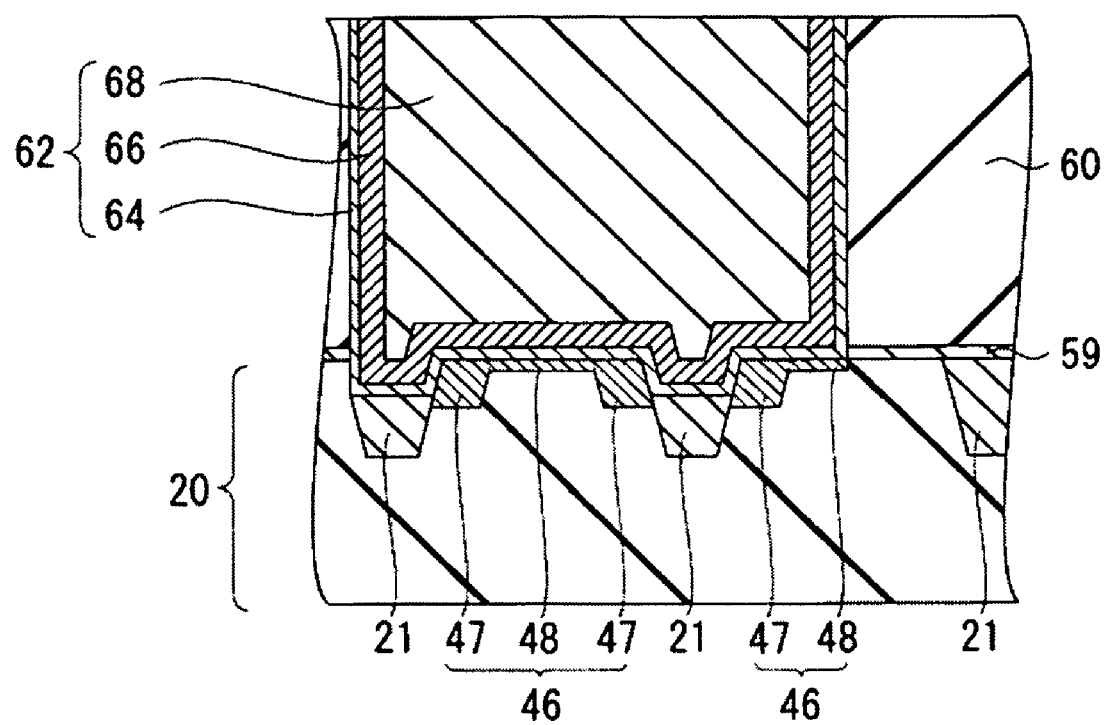
FIG. 3 is a schematic sectional view showing the semiconductor device for explaining a shift in an alignment of a cell contact with respect to an active area (a CC-AC alignment) according to the first embodiment of the present invention.

A shift in an alignment of the contact plug or cell contact 62 with respect to the active area 29b, (a CC-AC alignment) will be explained next. FIG. 3 is a schematic sectional view showing the semiconductor device when the shift in the CC-AC alignment occurs according to the first embodiment of the present invention.

As shown in FIG. 3, in the metal silicide films 46, the first portions 47 have the thickness t1 larger than the thickness t2 of the second portions 48. Accordingly, the first portions 47 have a resistivity lower than that of the second portions 48. As a result, the resistivity of the first portions 47 becomes substantially equal to a resistivity of the contact plug 62 (referred to as a contact resistivity).

In the embodiment, when the shift in the CC-AC alignment occurs, an area of the impurity diffused areas 40 just below the contact plug 62, that is, an area of the metal silicide films 46 contacting with the conductive plug 62, decreases. However, an area of the first portions 47 defining the contact resistivity does not change, thereby maintaining a constant resistivity as designed.

In the embodiment, the contact holes 61 are formed in a self-compatible manner in the first direction. Accordingly, it is possible to prevent an influence of a shift in an alignment of the conductive plugs 62 with respect to the gate electrodes 34 (referred to as a CC-CG alignment).

An experiment for measuring a change in the contact resistivity was conducted, and a result thereof will be explained next with reference to FIG. 4.

In the experiment, the element separation areas 29a, and the active areas 29b, had a width of 100, nm, and the conductive plugs 62 had a length of 300, nm in the row direction. Further, the first portions 47 of the metal silicide films 46 had the thickness t1 of 35, nm and the width w1 of 40, nm, and the second portions 48 of the metal silicide films 46 had the thickness t2 of 10, nm.

Figure 4:
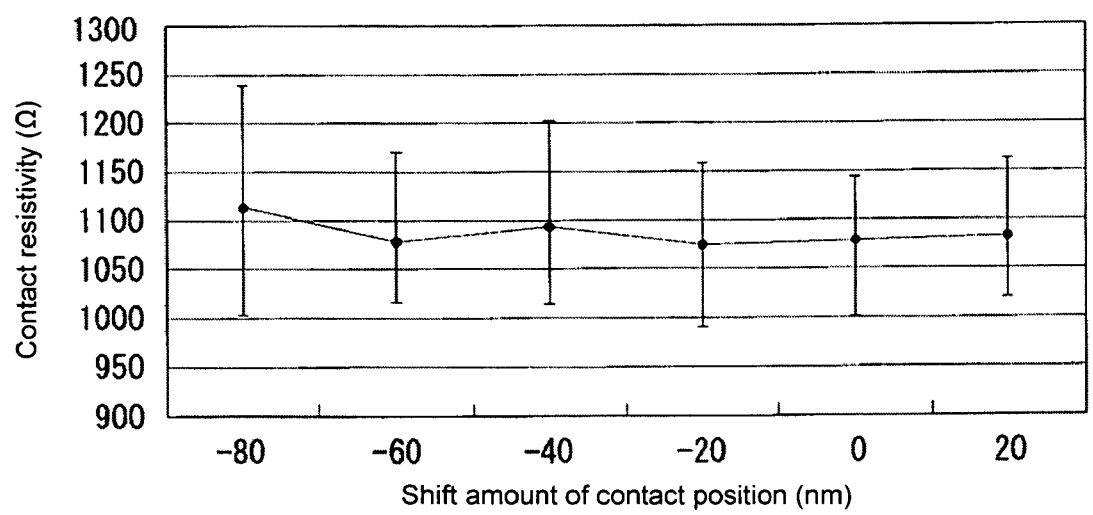
FIG. 4 is a graph showing a change in a contact resistivity associated with a shift in the CC-AC alignment according to the first embodiment of the present invention.

FIG. 4 is a graph showing the change in the contact resistivity associated with the shift in the CC-AC alignment according to the first embodiment of the present invention. In FIG. 4, the horizontal axis represents the shift in the alignment of the conductive plugs 62 with respect to the active areas 29b,, or a shift amount of a contact position (nm), and the vertical axis represents the contact resistivity (Ω). The contact resistivity was measured through a four-point measurement method using a Kelvin contact TEG (Test Element Group).

As shown in FIG. 4, when the shift in the CC-AC alignment is within a range between −80, nm to 20, nm, the contact resistivity remains constant at about 1,100Ω. In other words, when the shift in the CC-AC alignment is about 80, nm, there is no increase in the contact resistivity due to the shift in the CC-AC alignment.

Figure 5:
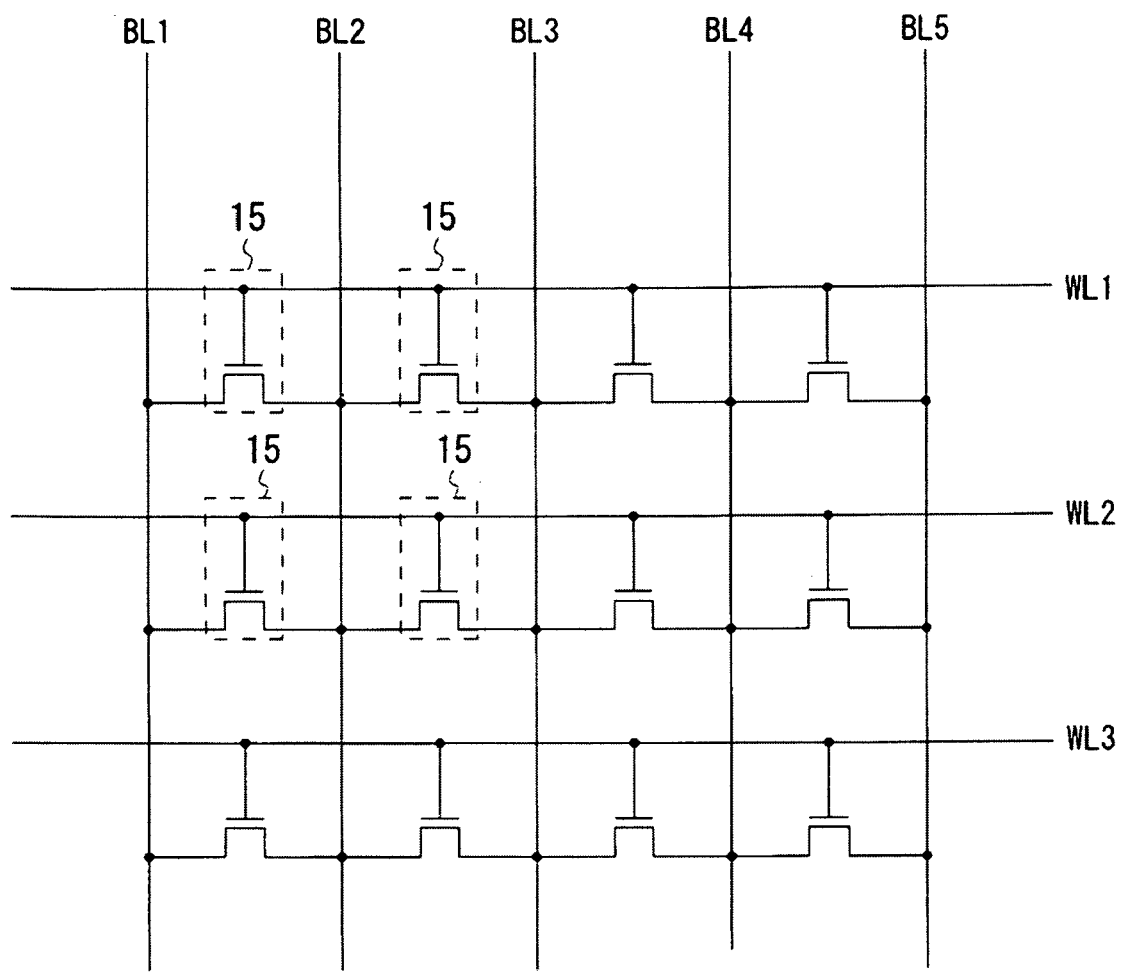
FIG. 5 is a circuit diagram showing an equivalent circuit of the semiconductor device according to the first embodiment of the present invention.
Figure 6:
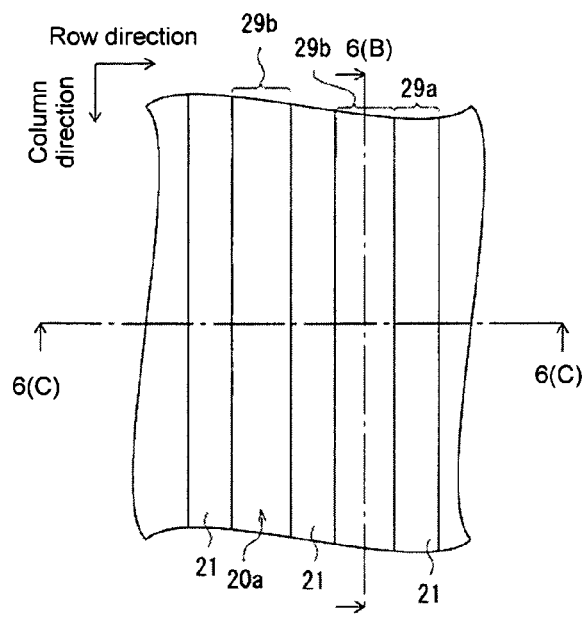
Figure 6:
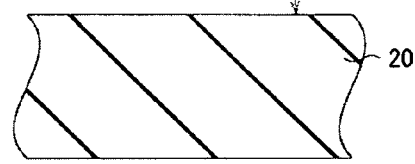
Figure 6:
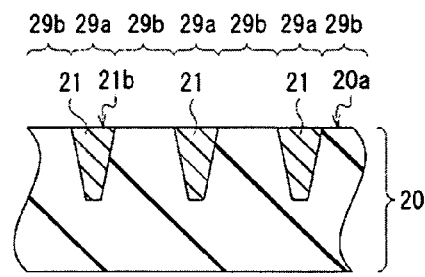
Figure 9:
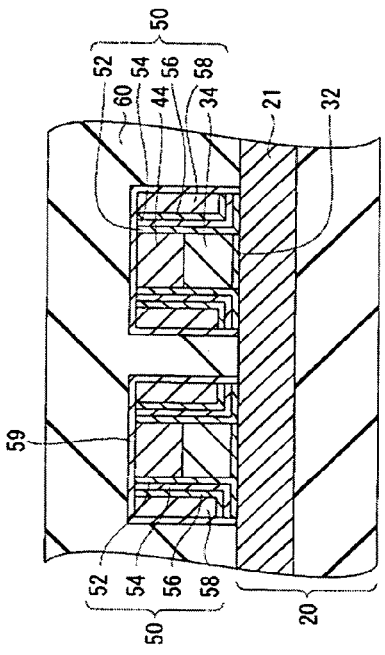
FIGS. 9(A) to 9(D) are schematic enlarged sectional views corresponding to the enlarged sectional view thereof taken along the line 7(C)-7(C) in FIG. 7(A) and showing the method of producing the semiconductor device according to the first embodiment of the present invention.
Figure 9:
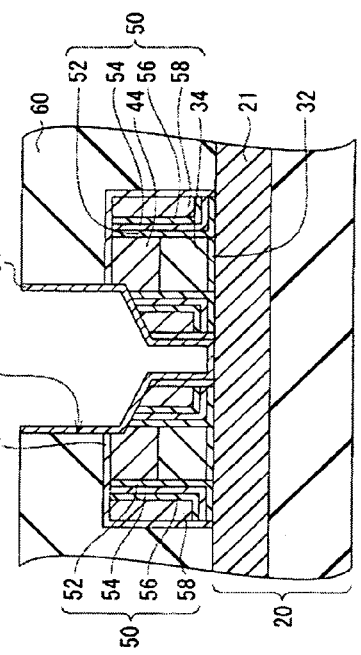
Figure 9:
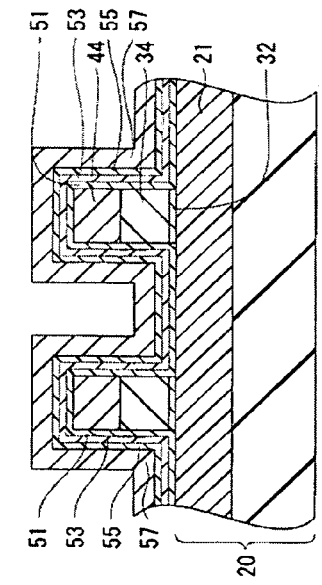
Figure 9:
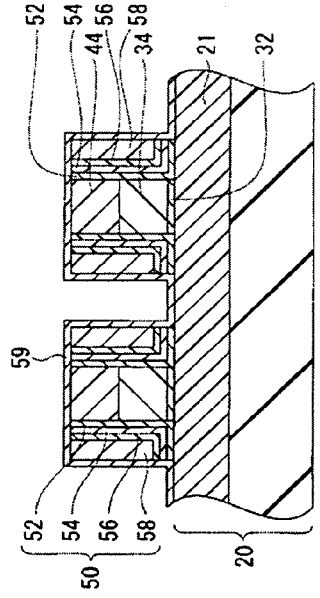
Figure 10:
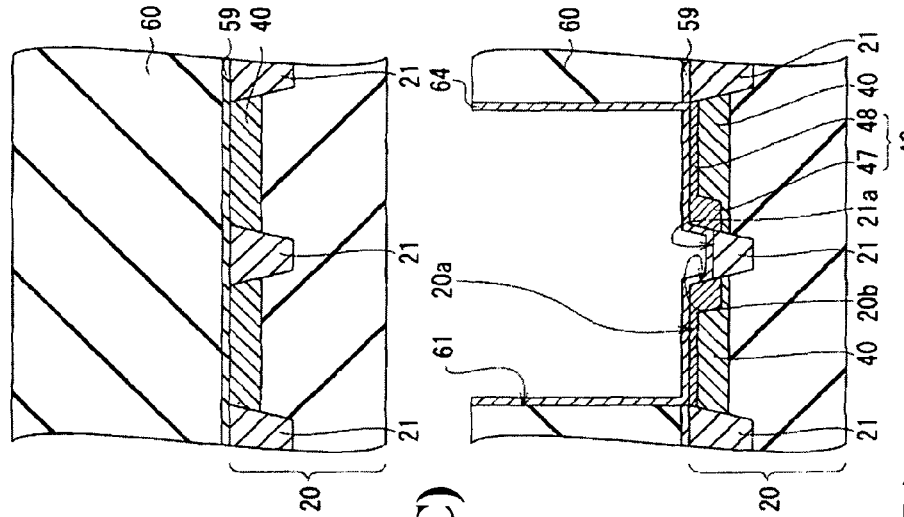
FIGS. 10(A) to 10(D) are schematic enlarged sectional views corresponding to the enlarged sectional view thereof taken along the line 7(C)-7(C) in FIG. 7(A) and showing the method of producing the semiconductor device according to the first embodiment of the present invention.

FIG. 5 is a circuit diagram showing an equivalent circuit of the semiconductor device according to the first embodiment of the present invention. As described above, the memory cells 15 arranged next to each other in the column direction share the impurity diffused portions 40 as shown in FIG. 1. Further, in the memory cells 15 arranged next to with each other in the row direction with the element separation areas 29a, in between, the impurity diffused portions 40 are commonly connected to a bit line (BL). Accordingly, it is possible to obtain the circuit shown in FIG. 5 in both the column direction and the row direction without increasing an element forming area.

As described above, in the embodiment, when the shift in the CC-AC alignment or the CC-CG alignment occurs, the contact resistivity does not increase. Accordingly, it is not necessary to provide a margin for alignment, thereby further decreasing the element forming area.

In the embodiment, the first conductive type is the p-type, and is not limited thereto. The first conductive type may be the n-type, and the second conductive type may be the p-type, so that the field effect transistor is an MOSFET of the p-type (PMOS).

Further, in the embodiment, the semiconductor device has the memory cells 15 arranged in the matrix pattern, and is not limited thereto. One cell contact (CC) may be adapted to electrically connect two semiconductor elements formed in active areas (AC) arranged next to each other with an element separation film in between. In this case, it is possible to prevent the contact resistance from increasing due to a shift in the CC-AC alignment.

A method of producing the semiconductor device according to the first embodiment of the present invention will be explained with reference to FIGS. 6(A) to 10(D).

FIGS. 6(A) to 6(C) are schematic views showing a method of producing the semiconductor device according to the first embodiment of the present invention. More specifically, FIG. 6(A) is a schematic plan view of the semiconductor device, FIG. 6(B) is an enlarged sectional view thereof taken along a line 6(B)-6(B) in FIG. 6(A), and FIG. 6(C) is an enlarged sectional view thereof taken along a line 6(C)-6(C) in FIG. 6(A).

FIGS. 7(A) to 7(D) are schematic views showing the method of producing the semiconductor device according to the first embodiment of the present invention. More specifically, FIG. 7(A) is a schematic plan view of the semiconductor device after a gate electrode is formed, FIG. 7(B) is an enlarged sectional view thereof taken along a line 7(B)-7(B) in FIG. 7(A), FIG. 7(C) is an enlarged sectional view thereof taken along a line 7(C)-7(C) in FIG. 7(A), and FIG. 7(D) is an enlarged sectional view thereof taken along a line 7(D)-7(D) in FIG. 7(A).

FIGS. 8(A) to 8(D) are schematic enlarged sectional views corresponding to the enlarged sectional view thereof taken along the line 7(B)-7(B) in FIG. 7(A) and showing the method of producing the semiconductor device according to the first embodiment of the present invention.

FIGS. 9(A) to 9(D) are schematic enlarged sectional views corresponding to the enlarged sectional view thereof taken along the line 7(C)-7(C) in FIG. 7(A) and showing the method of producing the semiconductor device according to the first embodiment of the present invention.

FIGS. 10(A) to 10(D) are schematic enlarged sectional views corresponding to the enlarged sectional view thereof taken along the line 7(C)-7(C) in FIG. 7(A) and showing the method of producing the semiconductor device according to the first embodiment of the present invention.

First, a silicon substrate of the p-type, for example, is prepared as the semiconductor substrate 20. As shown in FIGS. 6(A) and 6(B), the element separation areas 29a, are defined on the main surface 20a, of the semiconductor substrate 20. The element separation areas 29a, are provided at a plurality of locations, and extend in the column direction as the first direction. Further, the active areas 29b, are defined as areas between the element separation areas 29a.

In the next step, as shown in FIG. 6(C), the element separation films 21 are formed using silicon oxide with a well-known STI (Shallow Trench Isolation) method in the element separation areas 29a, of the semiconductor substrate 20. When the element separation films 21 are formed, upper surfaces 21b of the element separation films 21 and the main surface 20a, of the semiconductor substrate 20 are flattened.

In the next step, an insulation film, a conductive film, and a nitride film for forming a mask are sequentially laminated on the main surface 20a, of the semiconductor substrate 20. In this case, the insulation film may be formed of a silicon oxide film formed through, for example, thermal oxidation. In forming the conductive film, a ploy-silicon film and a tungsten silicide film as a metal silicide film are sequentially laminated with a chemical vapor deposition (CVD) method and a sputtering method. When or after the poly-silicon film is deposited, an impurity is doped, thereby obtaining conductivity. Afterward, a silicon nitride film as the nitride film for forming the mask is formed on the conductive film with, for example, a CVD method.

In the next step, the nitride film for forming the mask is patterned to form the nitride film masks 44 through well-known photolithography and dry etching. The nitride film masks 44 are formed in a plurality of band shapes extending in the row direction.

In the next step, using the nitride film masks 44 and a resist mask (not shown) formed through photolithography as described above, the conductive film is patterned through etching to form the gate electrodes 34. Further, using the resist mask, the nitride film masks 44, and the gate electrodes 34 as masks, the silicon oxide film is etched until a part of the main surface 20a, of the semiconductor substrate 20 is exposed, thereby forming the gate insulation films 32. After the resist masks formed on the nitride film masks 44 through photolithography are removed through ashing, wet cleaning is performed with a well-known method (as shown in FIGS. 7(A) to 7(C)).

In the next step, ions of the n-type such as arsenic (As) are introduced into the semiconductor substrate 20 at a low concentration of about $1 \times 10^{13}/cm^2$, with an ion introduction method to form LDD impurity diffused areas 41. In the ion introduction process, the nitride film masks 44 function as masks. Accordingly, low concentration areas are formed in the semiconductor substrate 20 over a range from the main surface 20a, of the semiconductor substrate 20 to an appropriate depth according to a design. After a thermal processing, areas other than channel forming areas below the gate electrodes 34 become the LDD impurity diffused areas 41.

In the next step, lower portion insulation films 51 are formed on the main surface 20a, of the semiconductor substrate 20 for covering the gate electrodes 34. Afterward, electric charge accumulation portion nitride films 53, upper portion insulation films 55, and sidewall portion nitride films 57 are sequentially formed on the lower portion insulation films 51. The lower portion insulation films 51, the electric charge accumulation portion nitride films 53, the upper portion insulation films 55, and the sidewall portion nitride films 57 are formed through the following process.

In the embodiment, the lower portion insulation films 51 are formed through thermal oxidation at an environmental temperature of about 1,000° C., and have a thickness of about 5, to 10, nm, so that the lower portion insulation films 51 are formed on the semiconductor substrate 20 to cover the gate electrodes 34. More specifically, the lower portion insulation films 51 are formed on the main surface 20a, of the semiconductor substrate 20, side surfaces of the gate insulation films 32 and the gate electrodes 34, and upper surfaces and side surfaces of the nitride film masks 44.

In the next step, the electric charge accumulation portion nitride films 53 are formed on the lower portion insulation films 51 as silicon nitride films having a thickness of about 5 to 10, nm.

In the next step, non-doped silicate glass (NSG) is deposited with, for example, a CVD method, so that the upper portion insulation films 55 are formed on the electric charge accumulation portion nitride films 53.

In the next step, the sidewall portion nitride films 57 are formed on the upper portion insulation films 55 as silicon nitride films having a thickness of about 5, to 20, nm (as shown in FIGS. 8(A), 9(A), and 10(A)).

After the lower portion insulation films 51, the electric charge accumulation portion nitride films 53, the upper portion insulation films 55, and the sidewall portion nitride films 57 are formed, the lower portion insulation films 51, the electric charge accumulation portion nitride films 53, the upper portion insulation films 55, and the sidewall portion nitride films 57 are etched to form the sidewall portions 50.

In the etching process described above, the etching is performed through anisotropic etching from a direction perpendicular to the main surface 20a, of the semiconductor substrate 20 until the nitride film masks 44 are exposed. With the etching process, the nitride film masks 44 and the sidewall portions 50 have flattened upper surfaces as the exposed surfaces. Further, the LDD impurity diffused areas 41 formed in the semiconductor substrate 20 outside the sidewall portions 50 have exposed surfaces.

In the next step, silicon nitride is deposited with a well-known CVD method, so that stopper nitride films 59 are formed on the main surface 20a, of the semiconductor substrate 20, the upper surfaces and the side surfaces of the sidewall portions 50, and the upper surfaces of the nitride film masks 44 (as shown in FIGS. 8(B), 9(B), and 10(B)).

In the next step, using mainly the nitride film masks 44, the gate electrodes 34, and the sidewall portions 50 as masks, impurity ions are introduced into the semiconductor substrate 20 at a high concentration. Then, a thermal processing is performed to form the impurity diffused portions 40.

More specifically, ions of the n-type such as arsenic (As) are introduced into the semiconductor substrate 20 at a high concentration of about $1\times10^{15}/cm^2$. Then, a thermal processing is performed to form the impurity diffused portions 40. Accordingly, the field effect transistors having pairs of the sidewall portions 50 at positions sandwiching the gate electrodes 34 are formed on the semiconductor substrate 20.

In the next step, the interlayer insulation films 60 are formed on the stopper nitride films 59. More specifically, after BPSG (Boron-Phosphorous Silicate Glass) is deposited with a well-known CVD method, the deposited portion is flattened with, for example, a CMP (Chemical Mechanical Polishing) method to form the interlayer insulation films 60 (as shown in FIGS. 8(C), 9(C), and 10(C)).

In the next step, the contact holes 61 are formed in the interlayer insulation films 60 through well-known photolithography and dry etching. Then, the stopper nitride films 59 exposed from bottom surfaces of the contact holes 61 are removed through dry etching using, for example, $C_4F_6$, gas as a reactive gas. As a result, the main surface 20a, of the semiconductor substrate 20 and the element separation films 21 are exposed from the bottom surfaces of the contact holes 61.

In the embodiment, each of the contact holes 61 is formed in an area from one of the impurity diffused portions 40 to another of the impurity diffused portions 40 arranged next to each other with one of the element separation films 21 in between. That is, the impurity diffused portions 40 of two of the memory cells 15 arranged next to each other in the row direction with one of the element separation films 21 in between are exposed in one of the contact holes 61.

When the stopper nitride films 59 are removed, over etching is performed using, for example, $CH_2F_2$, gas as a reactive gas, so that a position of the upper surfaces 21a, of the element separation films 21 becomes lower than a position of the main surface 20a, of the semiconductor substrate 20 by about 20, nm. More specifically, it is preferred that the position of the upper surfaces 21a, of the element separation films 21 is lower than the position of the main surface 20a, of the semiconductor substrate 20 by more than 10, nm. Accordingly, it is possible to form the metal silicide films having a sufficient thickness in the step of forming the metal silicide films (described later). Note that, considering an etching time and the likes, it is preferred that the position of the upper surfaces 21a, of the element separation films 21 is lower than the position of the main surface 20a, of the semiconductor substrate 20 by less than 50, nm.

After the resist masks formed on the interlayer insulation films 60 through photolithography are removed through ashing, wet cleaning is performed with a well-known method. Note that the contact holes 61 are formed in a self-compatible manner along the first direction. Accordingly, when a shift in the CC-CG alignment occurs, a property of the semiconductor non-volatile memory is hardly affected.

In the next step, the high melting temperature metal films 64 are formed in the contact holes 61, so that metal silicide is formed on the upper surfaces of the active areas 29b. More specifically, using $TiCl_4$, as a material gas, a plasma assist CVD is performed at a substrate temperature of about 630° C., so that titanium is deposited on inner surfaces of the contact holes 61 and titanium films are formed as the high melting temperature metal films 64. When titanium is deposited on the main surface 20a, of the semiconductor substrate 20, the titanium films become silicide at the same time. That is, titanium silicide is formed on the main surface 20a, of the semiconductor substrate 20 as the metal silicide films 46.

In this step, area portions on a side of the element separation films 21 of the semiconductor substrate 20 are covered with the element separation films 21 until just before the element separation films 21 are etched. Accordingly, when the element separation films 21 are etched to expose a main surface 20b, of the semiconductor substrate 20 on the side of the element separation films 21, the main surface 20b, is supposed to be very clean.

On the other hand, the main surface 20a, of the semiconductor substrate 20 away from the element separation films 21 is damaged due to carbon and oxygen implanted during the ion introduction or the etching for forming the sidewall portions 50. Accordingly, the main surface 20a, of the semiconductor substrate 20 away from the element separation films 21 is not supposed to be very clean.

In general, silicide grows on a cleaner surface at a faster speed. Accordingly, the area portions of the metal silicide films 46 contacting with the element separation films 21 of the semiconductor substrate 20 have a larger thickness. More specifically, the metal silicide films 46 have the first portions 47 contacting with the element separation films 21 and the second portions 48 away from the element separation films 21, and the first portions 47 have the thickness t1 larger than the thickness t2 of the second portions 48.

At this time, the element separation films 21 are etched due to chlorine radicals in plasma, so that titanium is not deposited on the element separation films 21. On the other hand, the silicide portions are not etched to a large extent, so that the metal silicide films 46 remain (as shown in FIGS. 8(D), 9(D), and 10(D)).

As explained above, in the embodiment, the first portions 47 of the metal silicide films 46 on the side of the element separation films 21 have the larger thickness, and the contact resistivity is determined according to the first portions 47 of the metal silicide films 46 having the larger thickness. Accordingly, when the shift in the CC-AC alignment occurs, and an area of the impurity diffused portions 40 exposed in the contact holes 61 increases, an area of the first portions 47 of the metal silicide films 46 having the larger thickness does not decrease. That is, the contact resistivity does not increase due to the shift in the CC-AC alignment.

In the embodiment, the metal silicide films 46 may be formed through RTN (Rapid Thermal Nitridation) after titanium is deposited with a sputtering method. In this case, it is necessary to increase a thickness of titanium. Accordingly, considering forming a fine pattern, it is preferred to use a plasma assist CVD method.

In the next step, after the close contact films 66 are formed on the high melting temperature metal films 64, the contact holes 61 are filled with the conductive members 68, thereby forming the conductive plugs 62. More specifically, TiN is deposited with a CVD method as the close contact films 66. Then, tungsten is deposited with a CVD method as the conductive members 68 to fill the contact holes 61.

In the next step, after NSG70 is deposited on the interlayer insulation films 60 with a CVD method, through holes are formed through photolithography and dry etching to expose the contact holes 61.

In the next step, after a resist is removed, TiN and tungsten are deposited with a CVD method, and are flattened with a CMP method, thereby forming the conductive plugs 62 in the through holes.

In the next step, after titanium, TiN, and AlCu are deposited with a sputtering method, the wiring portions 74 are formed through photolithography and dry etching. Accordingly, the semiconductor device shown in FIGS. 1 and 2(A) to 2(C) is obtained. In FIGS. 1 and 2(A) to 2(C), the wiring portions 74 are shown as bit lines (BL). A process after the bit lines are formed is similar to a well-known process, and an explanation thereof is omitted.

Second Embodiment

Figure 11:
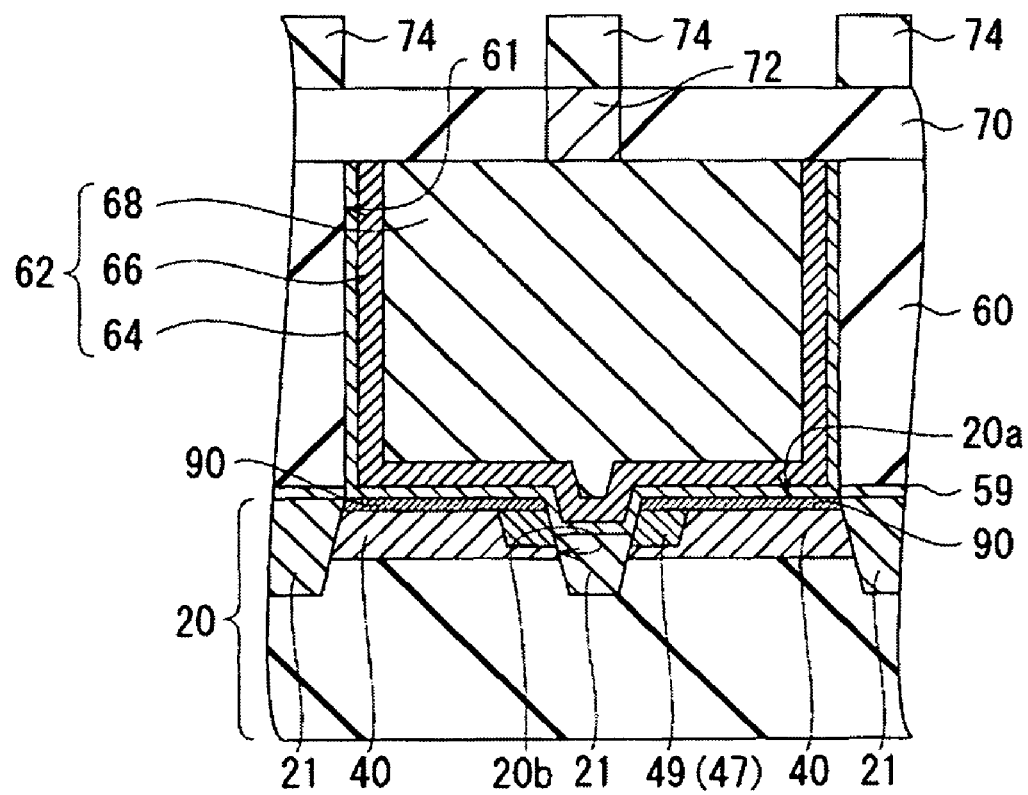
FIG. 11 is a schematic sectional view showing a semiconductor device corresponding to the sectional view taken along the line 2(C)-2(C) in FIG. 1 according to a second embodiment of the present invention.

A second embodiment of the present invention will be explained next with reference to FIG. 11. FIG. 11 is a schematic sectional view showing a semiconductor device corresponding to the sectional view taken along the line 2(C)-2(C) in FIG. 1 according to the second embodiment of the present invention.

Components in the second embodiment similar to those in the first embodiment are designated by the same reference numerals, and explanations thereof are omitted. Explanations of steps in a production process in the second embodiment similar to those in the first embodiment are omitted.

In the second embodiment, different from the first embodiment, a reaction prohibition layer 90 is formed on the semiconductor substrate in the contact hole. A metal silicide film is formed in an area portion on a side of the element separation areas in the contact hole, and is not formed in other area. That is, the metal silicide films 49 include only the first portions 47, and do not include the second portions 48.

As shown in FIG. 11, the reaction prohibition layer 90 is disposed on the main surface 20a, of the semiconductor substrate 20, and contacts with the conductive plug 62. The reaction prohibition layer 90 is formed of one or more materials selected from silicon nitride, silicon nitride oxide, silicon carbide, and silicon oxide containing carbon. A method of forming the reaction prohibition layer 90 will be explained later.

After the reaction prohibition layer 90 is formed, the metal silicide films 49 are formed. In the step, the metal silicide films 49 are not formed in an area where the reaction prohibition layer 90 is formed. Accordingly, the metal silicide films 49 are formed in an area near side surfaces 20b, on a side of the element separation film 21.

In the semiconductor device in the second embodiment, similar to that in the first embodiment, when the shift in the alignment of the contact hole with respect to the active area occurs, and an area of the active area exposed in the contact hole increases, an area of the metal silicide films 49 exposed in the contact hole does not decrease. Accordingly, it is possible to prevent the contact resistivity from increasing.

A method No. 1 of producing the semiconductor device according to the second embodiment will be explained next with reference to FIGS. 12(A) to 12(C).

Figure 12:
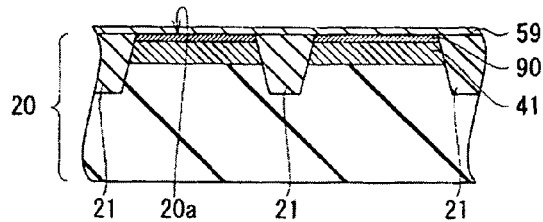
FIGS. 12(A) to 12(C) are enlarged schematic sectional views corresponding to the sectional view taken along the line 2(C)-2(C) in FIG. 1 and showing a method No. 1 of producing the semiconductor device according to the second embodiment of the present invention.
Figure 12:
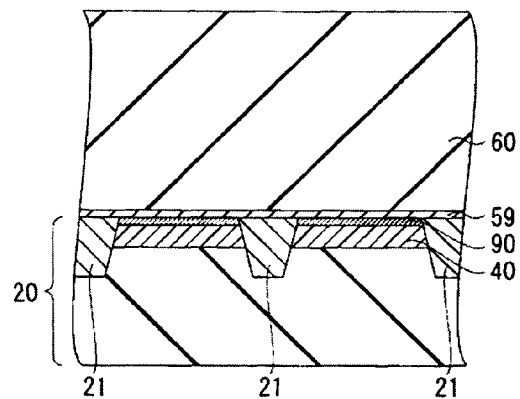
Figure 12:
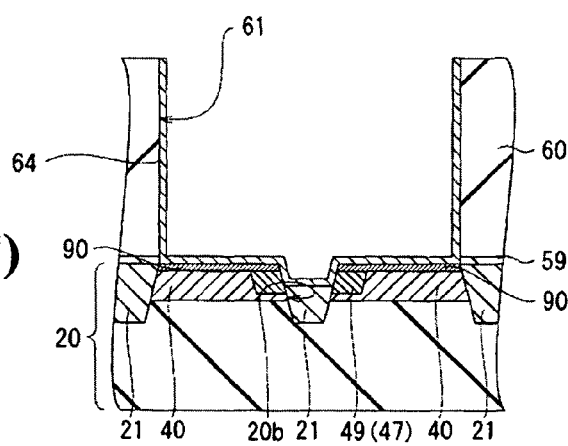

FIGS. 12(A) to 12(C) are enlarged schematic sectional views corresponding to the sectional view taken along the line 2(C)-2(C) in FIG. 1 and showing the method No. 1 of producing the semiconductor device according to the second embodiment of the present invention.

In the embodiment, sectional views corresponding to the sectional views taken along the line 2(A)-2(A) and the line 2(B)-2(B) in FIG. 1 are similar to FIGS. 9(A) to 9(D) and FIGS. 10(A) to 10(D). Accordingly, the method No. 1 of producing the semiconductor device will be explained with reference to FIGS. 9(A) to 9(D) and FIGS. 10(A) to 10(D) in addition to FIGS. 12(A) to 12(C).

A process up to the steps of forming the lower portion insulation films 51, the electric charge accumulation portion nitride films 53, the upper portion insulation films 55, and the sidewall portion nitride films 57 on the semiconductor substrate 20 is similar to that in the first embodiment shown in FIGS. 6(A) to 6(C), 7(A) to 7(D), 8(A), 9(A), and 10(A), and an explanation thereof is omitted.

In the next step, similar to the first embodiment, the sidewall portions 50 are formed. Then, the reaction prohibition layers 90 are formed on the main surface 20a, of the semiconductor substrate 20 in the active areas 29b, thus exposed. In forming the reaction prohibition layers 90, the main surface 20a, of the semiconductor substrate 20 is processed to become nitride through a plasma processing using one of both of $N_2$, and $NH_3$, as a reactive gas. Alternatively, the main surface 20a, of the semiconductor substrate 20 is processed and carbonized through a plasma processing using one of both of CO and $CO_2$, as a reactive gas.

In the next step, the stopper nitride films 59 are formed on the main surface 20a, of the semiconductor substrate 20, the upper surfaces and side surfaces of the sidewall portions 50, and the upper surfaces of the impurity diffused portions 40 (as shown in FIGS. 8(B), 9(B), and 12(A)).

A process after the step of forming the reaction prohibition layers 90 is similar to that in the first embodiment, and an explanation thereof is omitted.

After the stopper nitride films 59 are formed, similar to the first embodiment, the impurity diffused portions 40 are formed, and the interlayer insulation films 60 are formed on the stopper nitride films 59 (as shown in FIGS. 8(C), 9(C), and 12(B)).

In the next step, the contact holes 61 are formed in the interlayer insulation films 60 through well-known photolithography and dry etching. Then, the stopper nitride films 59 exposed from the bottom surfaces of the contact holes 61 are removed through dry etching. In removing the stopper nitride films 59, over etching is performed using, for example, $C_4F_6$, gas as a reactive gas. As a result, the upper surfaces 21a, i.e., the upper surfaces of the element separation films 21, are situated lower than the main surface 20a, of the semiconductor substrate 20 by about 20, nm.

After the resist masks formed on the interlayer insulation films 60 through photolithography are removed through ashing, wet cleaning is performed with a well-known method.

In the next step, the high melting temperature metal films 64 are formed in the contact holes 61, so that the metal silicide films 49 are formed on the upper surfaces of the active areas.

As described above, in the second embodiment, the reaction prohibition layers 90 are formed on the impurity diffused portions 40. Accordingly, only the side surfaces 20b, covered with the element separation films 21 through etching the element separation films 21 are exposed in the contact holes 61. As a result, in the step of forming the metal silicide films 49, the metal silicide films 49 are formed only on the semiconductor substrate 20 on the side of the element separation films 21, and are not formed in other area (as shown in FIG. 12(C)).

A method No. 2 of producing the semiconductor device according to the second embodiment will be explained next with reference to FIGS. 13(A) to 13(C).

Figure 13:
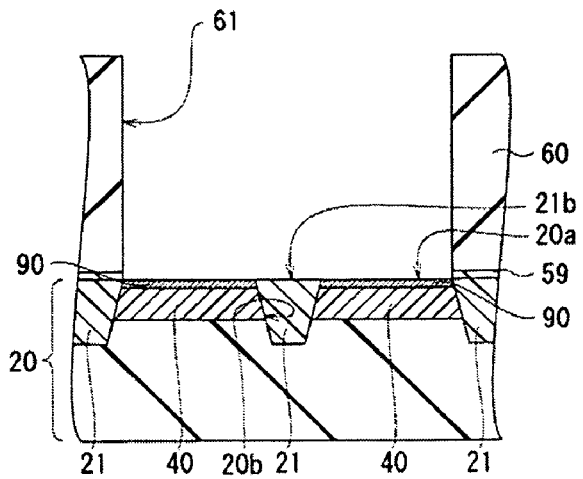
FIGS. 13(A) to 13(C) are enlarged schematic sectional views corresponding to the sectional view taken along the line 2(C)-2(C) in FIG. 1 and showing a method No. 2 of producing the semiconductor device according to the second embodiment of the present invention.
Figure 13:
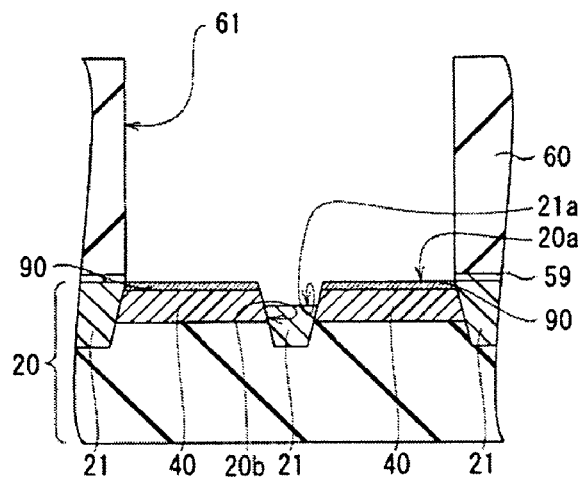
Figure 13:
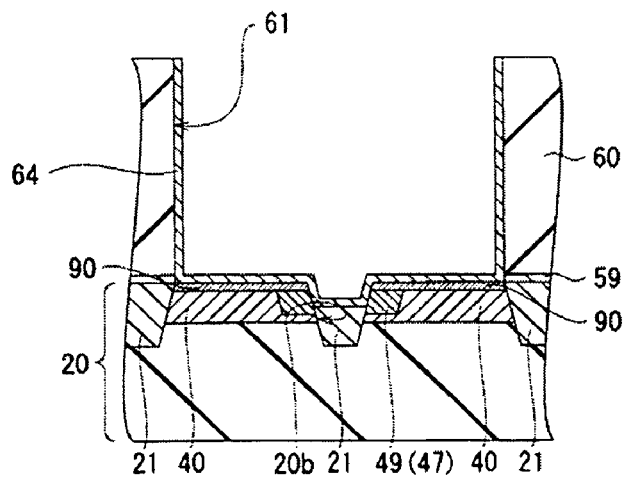
Figure 14:
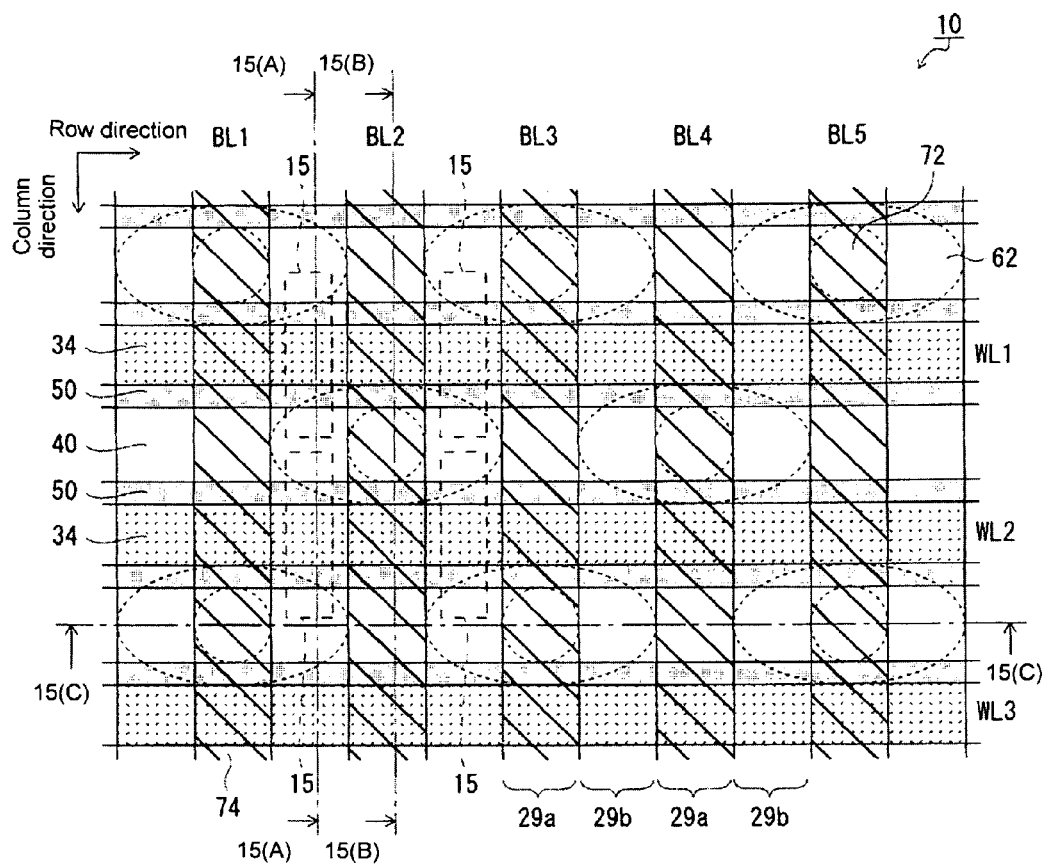
FIG. 14 is a schematic view showing a configuration of a conventional semiconductor non-volatile memory having memory cells arranged in a matrix pattern.
Figure 16:
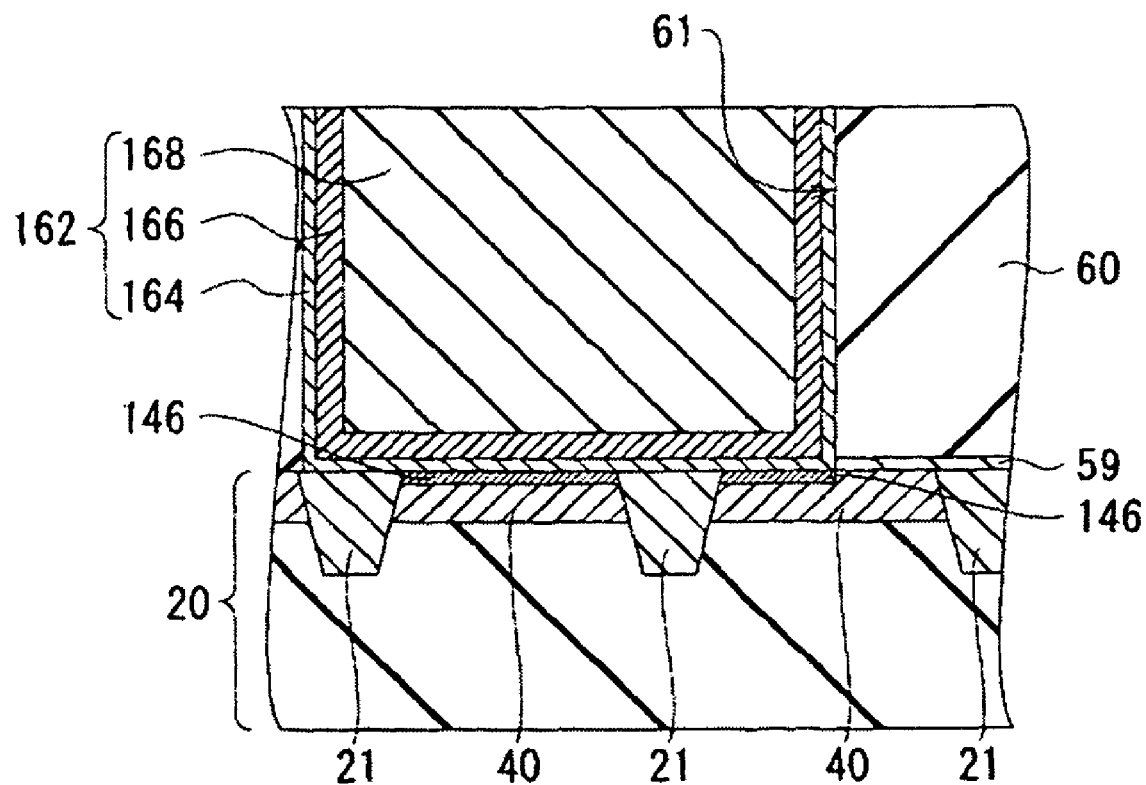
FIG. 16 is a schematic sectional view showing the conventional semiconductor non-volatile memory for explaining a shift in the CC-AC alignment.

FIGS. 13(A) to 13(C) are enlarged schematic sectional views corresponding to the sectional view taken along the line 2(C)-2(C) in FIG. 1 and showing a method No. 2 of producing the semiconductor device according to the second embodiment of the present invention.

In the embodiment, sectional views corresponding to the sectional views taken along the line 2(A)-2(A) and the line 2(B)-2(B) in FIG. 1 are similar to FIGS. 9(A) to 9(D) and FIGS. 10(A) to 10(D). Accordingly, the method No. 1 of producing the semiconductor device will be explained with reference to FIGS. 9(A) to 9(D) and FIGS. 10(A) to 10(D) in addition to FIGS. 13(A) to 13(C).

A process up to the steps of forming the interlayer insulation films 60 is similar to that in the first embodiment shown in FIGS. 6(A) to 6(C), 7(A) to 7(D), 8(A) to 8(C), 9(A) to 9(C), and 10(A) to 10(C), and an explanation thereof is omitted.

In the next step, similar to the first embodiment, the contact holes 61 are formed in the interlayer insulation films 60 through well-known photolithography and dry etching. Then, the stopper nitride films 59 exposed from the bottom surfaces of the contact holes 61 are removed through dry etching. Accordingly, the impurity diffused portions 40 and the element separation films 21 are exposed.

In the method No. 2 of producing the semiconductor device, the stopper nitride films 59 are removed through dry etching to a minimum extent to expose the impurity diffused portions 40 and the element separation films 21, and over etching is not performed. As a result, the upper surfaces 21a of the element separation films 21 are situated at a level substantially the same as that of the main surface 20a, of the semiconductor substrate 20.

In the next step, similar to the first embodiment, the reaction prohibition layers 90 are formed on the upper surfaces 21a, of the element separation films 21 in the active areas 29b exposed in the contact holes 61 (as shown in FIG. 13(A)).

After the resist masks formed on the interlayer insulation films 60 through photolithography are removed through ashing, wet cleaning is performed using diluted hydrofluoric acid, so that the upper surface 21a, of the element separation film 21 is etched through wet etching. As a result, the upper surface 21a of the element separation film 21 is situated lower than the main surface 20a, of the semiconductor substrate 20 by about 10 nm (as shown in FIG. 13(B)).

In the next step, the high melting temperature metal films 64 are formed in the contact holes 61, so that the metal silicide films 49 are formed on the upper surfaces of the active areas (as shown in FIG. 13(C)).

As described above, in the method No. 2 of producing the semiconductor device in the second embodiment, similar to the method No. 1, the reaction prohibition layers 90 are formed on the impurity diffused portions 40. Accordingly, only the side surfaces 20b, covered with the element separation films 21 through etching the element separation films 21 are exposed in the contact holes 61. As a result, in the step of forming the metal silicide films 49, the metal silicide films 49 are formed only on the semiconductor substrate 20 on the side of the element separation films 21, and are not formed in other area (as shown in FIG. 12(C)).

A process after the step of forming the metal silicide films 49 is similar to that in the method No. 1, and an explanation thereof is omitted.

As described above, in the method No. 2 of producing the semiconductor device in the second embodiment, the reaction prohibition layers 90 are formed after etching the contact holes 61. Accordingly, in etching the contact holes 61, the reaction prohibition layers 90 are not removed. As a result, it is possible to form the metal silicide films 49 at desired locations.

The disclosure of Japanese Patent Application No. 2007-087145, filed on Mar. 29, 2007, is incorporated in the application by reference.

While the invention has been explained with reference to the specific embodiments of the invention, the explanation is illustrative and the invention is limited only by the appended claims.

What is claimed is:

1. A semiconductor device comprising:
    a semiconductor substrate having a main surface;
    an element separation film formed on the main surface in an element separation area, said element separation film extending in a first direction;
    a semiconductor element formed on the main surface in an. active area and arranged in a second direction perpendicular to the first direction, said semiconductor element including a metal silicide film, said metal silicide film including a first portion adjacent to the element separation film, said metal silicide film further including a second portion away from the element separation film, said second portion having a thickness smaller than that of the first portion;
    an interlayer insulation film formed on the main surface;
    a wiring portion formed on the interlayer insulation film; and
    a conductive plug formed in the interlayer insulation film for electrically connecting the semiconductor elements and the wiring portion, said conductive plug being situated on the element separation film and the metal silicide film.

2. The semiconductor device according to claim 1, further comprising a reaction prohibition Layer disposed on the main surface contacting with the conductive plug.

3. The semiconductor device according to claim 2, wherein said reaction prohibition layer contains at least one of silicon nitride, silicon nitride oxide, silicon carbide, and silicon oxide containing carbon.

4. The semiconductor device according to claim 1, wherein said first portion has a thickness between 10 nm and 50nm and a length along the second direction between 10 nm and 50nm.

5. The semiconductor device according to claim 1, wherein said element separation film has an upper surface recessed with respect to the main surface.

6. The semiconductor device according to claim 1, wherein said element separation film has an upper surface at a level different from that of the main surface by a distance between 10 nm and 50 nm.

7. The semiconductor device according to claim 1, wherein said semiconductor element further includes a gate insulation film disposed on the main surface; a gate electrode disposed on the gate insulation film; a pair of impurity diffused portions sandwiching the gate electrode; and a pair of sidewall portions adjacent to the gate electrode for accumulating electric charges, said gate electrode being shared with an adjacent semiconductor, element arranged next to the semiconductor element along the second direction.

8. The semiconductor device according to claim 1, wherein said semiconductor element further includes a low concentration impurity diffused portion in the semiconductor substrate at a position between the impurity diffused portions and a portion just below the gate electrode where a channel is formed, said low concentration impurity diffused portion having an impurity concentration smaller than that of the impurity diffused portions, said low concentration impurity diffused portion having a conductive type the same as that of the impurity diffused portions.

* * * * *